United States Patent [19]
Hu et al.

[11] Patent Number: 5,780,899
[45] Date of Patent: Jul. 14, 1998

[54] DELTA DOPED AND COUNTER DOPED DYNAMIC THRESHOLD VOLTAGE MOSFET FOR ULTRA-LOW VOLTAGE OPERATION

[75] Inventors: Chenming Hu, Alamo; Hsing-Jen Wann, Albany, both of Calif.

[73] Assignee: The Regents of the University of California, Oakland, Calif.

[21] Appl. No.: 534,527

[22] Filed: Sep. 27, 1995

Related U.S. Application Data

[63] Continuation-in-part of Ser. No. 297,995, Aug. 30, 1994, Pat. No. 5,559,368.

[51] Int. Cl.$^6$ .......................... H01L 29/76; H01L 29/94; H01L 27/01
[52] U.S. Cl. .......................... 257/335; 257/338; 257/350
[58] Field of Search .......................... 257/192, 194, 257/335, 338, 343

[56] References Cited

U.S. PATENT DOCUMENTS

| | | | |
|---|---|---|---|
| 5,212,104 | 5/1993 | Klose | 437/40 |
| 5,272,432 | 12/1993 | Nguyen et al. | 323/315 |
| 5,329,138 | 7/1994 | Mitani et al. | 257/345 |
| 5,488,237 | 1/1996 | Kuwata | 257/194 |

OTHER PUBLICATIONS

Santoni, "Sub–Volt ICs Raise Technology Issues"; Electronic News, vol. 41, No. 2066, May 22, 1995.

Colinge, Jean–Pierre, An SOI Voltage–Controlled Bipolar–MOS Device, IEEE Transactions on Electron Devices, vol. ED–34, No. 4, Apr. 1987, pp. 845–849.

Verdonckt-Vandebroek, Sophie, et al., High–Gain Lateral Bipolar Action in a MOSFET Structure, IEEE Trans. on Electron Devices, vol. 38, No. 11, Nov. 1991, pp. 2487–2495.

Parke, Stephen, et al., Bipolar–FET Hybrid–Mode Operation of Quarter–Micrometer SOI MOSFETS, IEEE Electron Device Letters, vol. 14, No. 5, May 1993, pp. 234–236.

Assaderahi, Fariborz, et al., A Novel Silicon–On–Insulator (SOI MOSFET for Ultra Low Voltage Operation, 1994 IEEE Symposium on Low Power Electronics, Oct. 10–12, San Diego, CA, pp. 58–59.

*Primary Examiner*—Wael Fahmy
*Attorney, Agent, or Firm*—Townsend and Townsend and Crew, LLP; Henry K. Woodward

[57] ABSTRACT

A dynamic threshold voltage IGFET such as a MOSFET is operable at voltages of 0.6 volt or less. The threshold voltage of the transistor is reduced to zero volt or less by interconnecting the gate contact and the device body in which the voltage controlled channel is located. The channel region is delta-doped or counter-doped which permits superior performance for high-end VSLI applications. A selective epitaxy on a counter-doped substrate can be used in a counter-doped device. Doped wells can be used in a bulk silicon substrate in forming the devices. Trenching can be used to isolate devices in the doped wells.

4 Claims, 5 Drawing Sheets

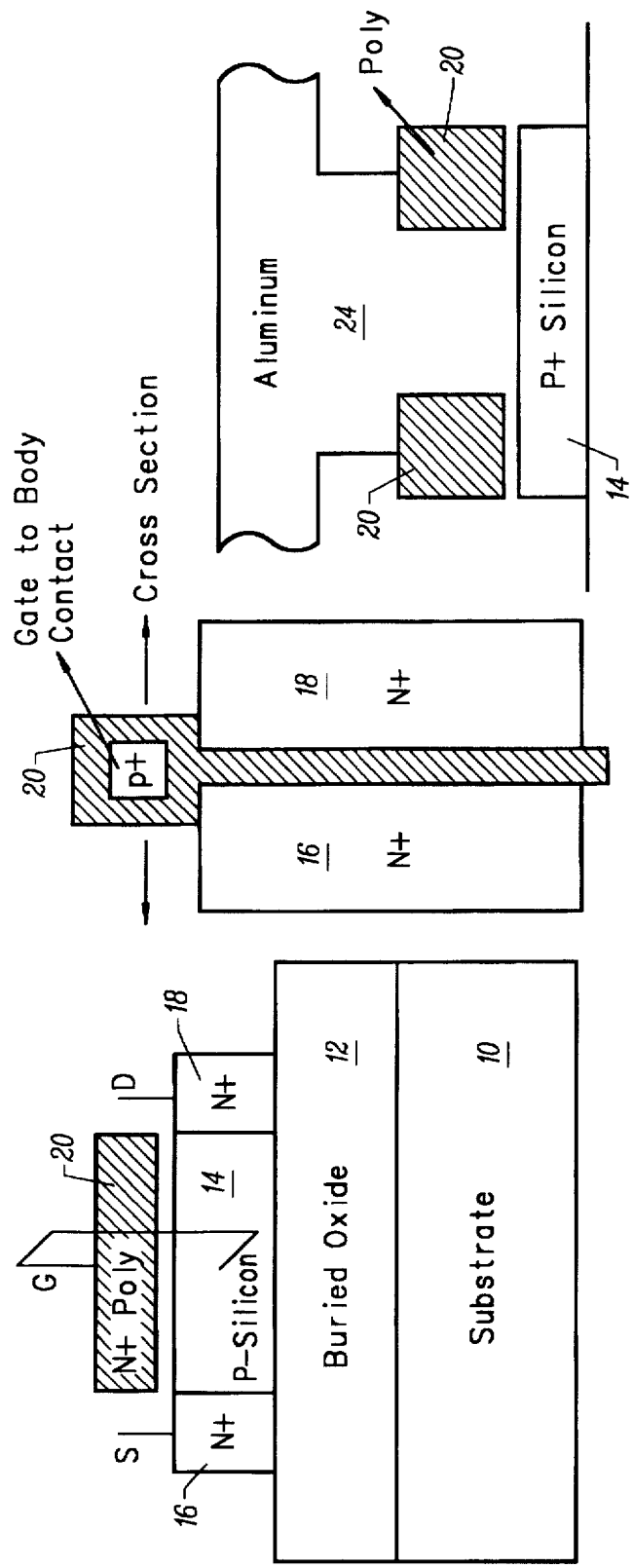

5,780,899

1

DELTA DOPED AND COUNTER DOPED DYNAMIC THRESHOLD VOLTAGE MOSFET FOR ULTRA-LOW VOLTAGE OPERATION

This patent application is a continuation-in-part of patent application Ser. No. 297,995 filed Aug. 30, 1994, now U.S. Pat. No. 5,559,368.

This invention was made with Government support under Grant (Contract) No. F49620-93-C0014 awarded by the Air Force Office of Scientific Research/Joint Services Electronics Program. The Government has certain rights to this invention.

BACKGROUND OF THE INVENTION

This invention relates generally to insulated gate field effect transistors (IGFETs) such as MOSFET devices and integrated circuits, and more particularly the invention is directed to such devices and integrated circuits which can operate at an ultra-low voltage of 0.6 volt or less.

During the past few years, demand for high performance and low power digital systems has grown very rapidly. Several factors have contributed to this fast growth. First, laptop and notebook computers, and personal communication systems have gained popularity. Consequently, portable applications that traditionally required a modest performance (such as wrist watches and calculators) are now dominated by devices that demand a very high performance. The demand for portability of these new systems limits their weight and size, placing a severe constraint on their power dissipation. Second, speed, density and size of non-portable CMOS based systems have increased tremendously in recent years. Thus, power consumption, which was not a concern in these systems, now is becoming a critical parameter.

The main approach for reducing power has relied on power supply scaling. This is due to the fact that in CMOS digital circuits delivered power is proportional to the square of power supply voltage. Since power supply reduction below three times the threshold voltage ($3V_t$) will degrade circuit speed significantly, scaling of power supply should be accompanied by threshold voltage reduction. However, the lower limit for threshold voltage is set by the amount of off-state leakage current that can be tolerated (due to standby power consideration in static circuits, and avoidance of failure in dynamic circuits and memory arrays). It is seen that if regular MOSFETs are used, a lower bound for power supply voltage becomes inevitable.

Silicon-on-insulator (SOI) technology offers much promise for ultra large scale integrated circuits using sub-micron gate technology. This technology employs a layer of semiconductor material overlying an insulation layer on a supporting bulk wafer. The structure can be formed by a number of well-known techniques, such as zone melting and recrystallization (ZMR), separation by implanted oxygen (SIMOX), and Bonded and Etchback (BESOI). Typically, the structure comprises a film of monocrystalline silicon on a buried layer of silicon oxide in a monocrystalline silicon substrate.

The bulk silicon material in which the channel of a MOSFET device is formed is typically grounded or connected to the source region of the device. However, in SOI MOSFETs the monocrystalline silicon film is often unbiased or floating. Heretofore, a SOI MOSFET has been operated as a lateral bipolar transistor by connecting the silicon film to the gate and exploiting the extra current produced by the device. However, this operation requires the body voltage to be larger than 0.6 volt. And since the current gain of the

2 bipolar device is small, the extra drain (collector) current comes at the cost of excessive input (base) current, which contributes to standby current. This is contrary to a low-power operation.

In co-pending patent application no. 08/297,955, supra, there is disclosed a dynamic threshold MOSFET (DTMOS) or an IGFET such as a MOSFET formed in an SOI structure which includes a gate to body connection to reduce turn-on voltage ($V_t$) and extend the lower bound of power supply voltage to an ultra-low level (i.e., 0.6 volt or less). The body contact can be provided by metal through a contact window in a polysilicon gate to the underlying film. Alternatively, the polysilicon gate can contact the silicon film directly through a contact window in the gate insulation. Also, separate contacts can be provided to the polysilicon gate, and to the body. These contacts can be shorted by the first-layer metal.

The present invention uses delta doping and counter doping in the DTMOS device to provide a low-power device having superior performance for high-end VLSI applications.

SUMMARY OF THE INVENTION

Briefly, the DTMOS device in accordance with the invention comprises a silicon on insulator (SOI) structure or a bulk silicon substrate transistor in which the gate contact is connected to the channel body with the channel having a dopant profile to realize a small off voltage ($V_{T\text{-}OFF}$) and a larger dynamic threshold voltage change ($\Delta V_T$).

In one embodiment, an abruptly-retrograded doping profile is used for the channel doping. The doping concentration at the silicon/silicon oxide interface under the gate contact is at least 5 times lower than the peak concentration in the silicon body. This doping profile can be realized by forming a selective epitaxy layer on a counter doped substrate (SECOS process) which produces a heavily doped layer, and a lightly doped channel.

In another embodiment, a dynamic threshold MOSFET is formed in a bulk silicon substrate using deep and shallow doped wells in the substrate for counter doping with trench isolation of devices. For example, deep n-wells are formed in a p-substrate, shallow p-wells are formed in the deep n-wells for n-channel devices and shallow n-wells are formed in the p-substrate for p-channel devices. Trench isolation isolates transistors in the shallow wells.

The DTMOS devices can be used with conventional CMOS devices in an integrated circuit with the DTMOS devices providing high performance or low leakage while the CMOS devices provide greater layout density where performance or leakage can be traded. The DTMOS devices will have gate to body interconnections, while the CMOS devices have body to $V_{DD}$ or $V_{SS}$ connections.

The invention and objects and features thereof will be more readily apparent from the following detailed description and appended claims when taken with the drawings.

BRIEF DESCRIPTION OF THE DRAWINGS

FIG. 1 is a schematic representation of a DTMOS device formed in a silicon on insulator (SOI) body.

FIGS. 2A and 2B are a top view and a side view in section of one embodiment of the DTMOS device of FIG. 1.

DETAILED DESCRIPTION OF ILLUSTRATIVE EMBODIMENTS

Figure 3:
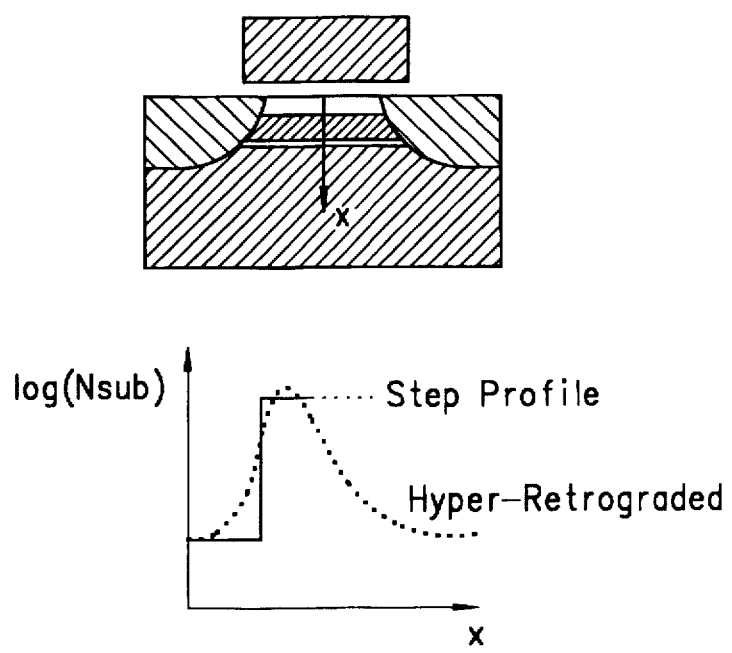
FIG. 3 illustrates an abruptly retrograded doping profile for DTMOS channel doping in accordance with one embodiment of the present invention.

FIGS. 1 and 2 illustrate dynamic threshold MOS (DTMOS) devices as disclosed in co-pending application Ser. No. 08/297,995, supra. In FIGS. 1 and 2, silicon substrate 10 has a buried oxide layer 12 formed therein with P– silicon film 14 on layer 12. N+ source 16 and N+ drain 18 are formed in film 14 with a gate electrode 20 formed over gate insulation 22 and the channel region between source 16 and drain 18. Gate 20 and film 14 are interconnected by connection 24. For NMOS, this connection uses an oversized metal-to-P+ contact window aligned over a "hole" in the poly gate. The metal shorts the gate and the P– region. This ensures that the body-to-gate connection does not come at the expense of a significantly larger device area. A similar structure is used for PMOS device except that the P– region is replaced by an N– region.

With the gate-to-body contact configuration, the threshold voltage $V_T$ of DTMOSFET varies according to the gate voltage $V_G$ in a desirable manner. N-channel devices will be used as examples herein, and the application of the invention to p-channel devices is obvious. When the input gate/body voltage is low, the device has high threshold voltage to suppress the off-state leakage current. When the input gate/body voltage is high, the device threshold voltage is reduced by the body effect thereby the output current drive is increased. To suppress the unwanted circuit flow between the body and its surrounding junctions, the operating voltage of the DTMOS device should be less than the p-n junction turn-on voltage by about 0.7 V. The percentage improvement in device switching speed by the dynamic threshold voltage effect is larger at lower operating voltages. Hence the DTMOS is an ideal low voltage device. For example the intrinsic gate delay, to the first order, can be estimated as follows:

$$\tau_d \propto \frac{C_{OX}V_{DD}\left(1+\frac{\Delta V_T}{V_{DD}}\right)}{I_{DSAT}} = \frac{C_{OX}(V_{DD}+\Delta V_T)}{C_{OX}(V_{DD}+\Delta V_T-V_{T-OFF})} = \frac{V_{DD}+\Delta V_T}{V_{DD}+\Delta V_T-V_{T-OFF}} \quad (1)$$

Thus the intrinsic gate delay of a DTMOS device operated at $V_{DD}$ is effectively equal to a conventional MOSFET operated at $V_{DD}+\Delta V_T$, while both have the same off-state threshold voltage, $V_{T-OFF}$, hence the same leakage current. Note that the extra loading to the gate caused by the body loading has been included in this analysis by estimating the input capacitance as $C_{OX}(1+\Delta V_T/V_{DD})$. The advantage is even more pronounced when DTMOS is driving big capacitance load, $C_L$:

$$\tau_d \propto \frac{C_L V_{DD} + C_{OX}V_{DD}\left(1+\frac{\Delta V_T}{V_{DD}}\right)}{I_{DSAT}} \approx \frac{C_L V_{DD}}{C_{OX}(V_{DD}+\Delta V_T-V_{T-OFF})} \quad (2)$$

From (1) and (2) it is seen that the larger the dynamic threshold voltage change $\Delta V_T$, the more advantage in speed.

However, $\Delta V_T$ is determined by $V_T$-OFF and the body doping profile. For example, with uniform body doping profile, the relation between $\Delta V_T$ and $V_{T-OFF}$ is:

$$\Delta V_T = (V_{T-OFF} - V_{FB} - 2\Phi_B)\left(1 - \frac{\sqrt{2\Phi_B - V_{DD}}}{\sqrt{2\Phi_B}}\right) \quad (3)$$

For $V_{DD}$=0.6V, $\Delta V_T$~0.5$V_{T-OFF}$. Thus the dynamic threshold effect becomes less prominent at small $V_{T-OFF}$. Larger $\Delta V_T$ can be obtained by employing larger $V_{T-OFF}$, yet the overall switching speed becomes slower. The present invention makes possible DTMOS with small $V_{T-OFF}$ and larger $\Delta V_T$.

In one embodiment of this invention illustrated in FIG. 3, an abruptly retrograded doping profile is used for DTMOS channel doping. The doping concentration at the Si/SiO$_2$ interface is at least 5 times lower than the peak concentration in the body. The processing technology for realizing the hyper-retrograded doping profile can be found in the literature, for example, K. Noda, et al., "0.1 mm Delta-Doped MOSFET Using Post Low-Energy Implanting Selective Epitaxy," 1994 Symposium on VLSI Technology Digest of Technical Papers, p. 19. With the ideal hyper-retrograded doping profile the dependence of $\Delta V_T$ on $V_{T-OFF}$ becomes:

$$\Delta V_T = (V_{T-OFF} - V_{FB} - 2\Phi_B)\left(\frac{V_{DD}}{2\Phi_B}\right) \quad (4)$$

Figure 4:
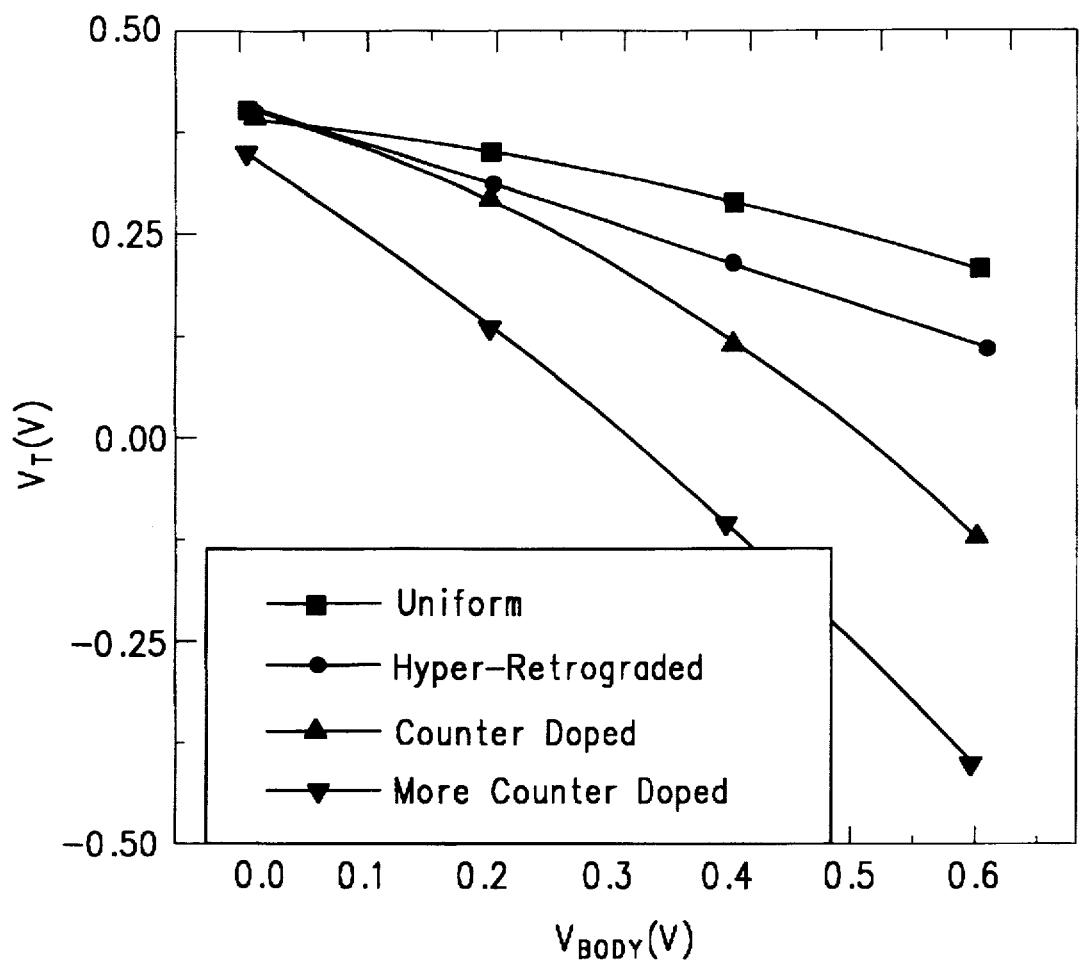
FIG. 4 is a plot of dynamic threshold voltage change, $\Delta V_T$, versus body voltage ($V_{BODY}$) as a function of body doping.
Figure 5:
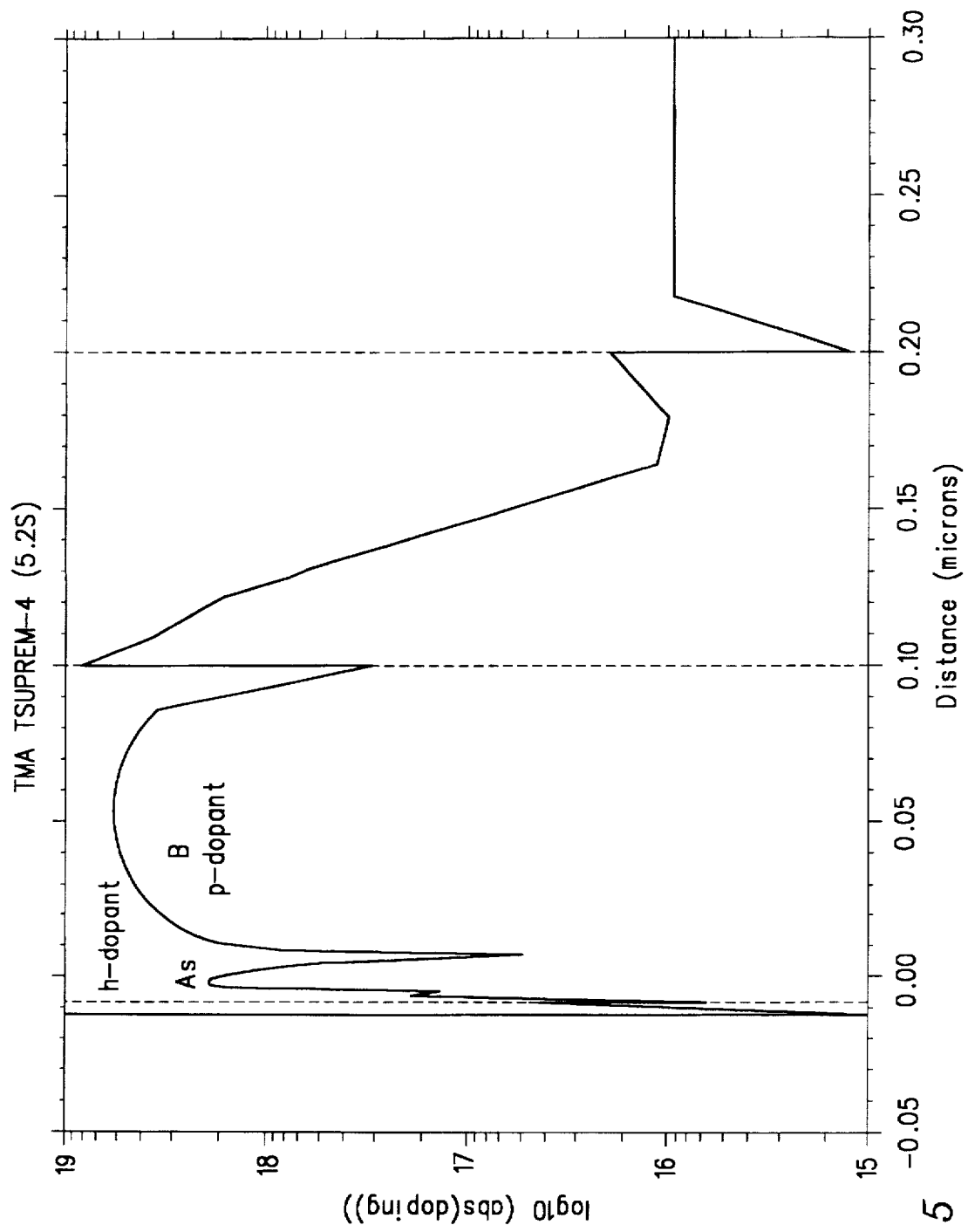
FIG. 5 illustrates one embodiment of body dopant concentration versus depth with a counter doped body.

Therefore, for the same $V_{T-OFF}$, larger $\Delta V_T$ can be achieved. For example, at $V_{DD}$=0.6V, $\Delta V_T$~0.8$V_{T-OFF}$ as shown in FIG. 4. Since $\Delta V_T$ is raised by reducing the doping concentration at the surface, it can be further raised by counter-doping the surface with dopant of the opposite type. In the second embodiment of this invention, a counter-doped layer is placed underneath the channel to form counter-doped channel DTMOS. This counter-doping layer, an example of which is shown in FIG. 5, can further increase $\Delta V_T$ as seen in FIG. 4. A thin counter-doped layer can be totally depleted at $V_G$=0 V. The total depletion charge, which includes the depleted counterdoped layer and the depleted substrate, determines the off-state threshold voltage of counter-doped channel DTMOS. When a voltage is applied to the gate (and the body) and the device starts to turn on, the inversion layer at the interface is formed Depending on the amount of counter-doping, two conditions in channel charge distribution may exist when the device is turned on. In one case a part of the counter-doped layer becomes quasi-neutral and conducts current. In the other case the counter-doped layer remains totally depleted In either case, when $V_{DD}$ is applied to the body, i.e., in the on-state of the device, the threshold voltage of counter-doped DTMOS can be negative as shown in FIG. 4. Since the carriers may reside partially in the counter-doped layer and are far away from the interface, higher carrier mobility is realized. The device may be thought of as a dual-gate device with a MOS gate on top and a JFET gate at the bottom, integrated in a compact and manufacturable device.

One way to form the desirable doping profile is to use selective epitaxy layer on counter-doped substrate (SECOS) process which produces a heavily-doped substrate, a thin counter-doped layer, and a lightly-doped channel. Taking n-channel MOSFET as an example, a high dose implantation of boron is performed on the substrate to suppress the shortchannel effect. An optional sacrificial oxide layer or other thin film that slows down the implanted ions is then grown or deposited on the top of the substrate. A high dose, low energy implantation of arsenic through the optional sacrificial oxide is used for the counter-doped layer. The shallow counter-doped layer is thus formed. The oxide is then removed and the selective epitaxy is performed. The outdiffusion can be minimized by low temperature selective epitaxy (~650 C.) hence the MOSFET channel doping concentration is kept low. An example of the final profile is shown in FIG. 5.

Figure 6:
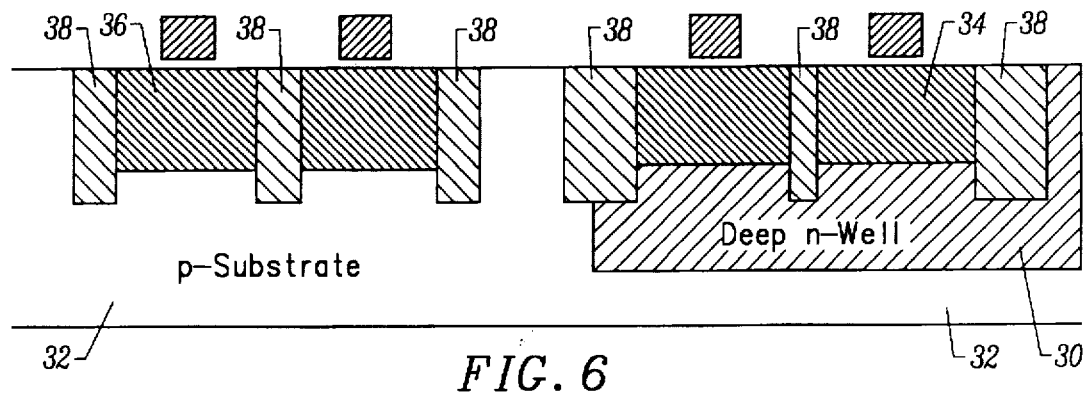
FIGS. 6, 7, and 8 are section views illustrating embodiments of the invention formed in a bulk silicon substrate using deep and shallow wells and trench isolation.

Implementation of the dynamic threshold MOSFET on bulk silicon substrate in accordance with another embodiment of the invention will now be described. FIG. 6 shows the first preferred embodiment using triple well technology and trench isolation. In FIG. 6, deep n-wells 30 are formed in a p-type substrate 32, shallow p-wells 34 are formed in deep n-wells, and shallow n-wells 36 are formed in the p-substrate 32. Within the shallow p-well, n-channel transistors are formed (n-doped source and drain); and within the shallow n-well p-channel transistors are formed (p-doped source and drain). Trench isolation 38 is used to isolate neighboring transistors in the same shallow-wells. The trench depth is larger than the shallow-well depth so that each transistor has its own isolated-body. Each transistor's body is electrically connected to its gate. The deep n-wells are connected to $V_{DD}$ and the p-substrate is grounded. The same gate-to-body contact schemes as in FIGS. 1 and 2 can be applied to this embodiment.

Figure 7:
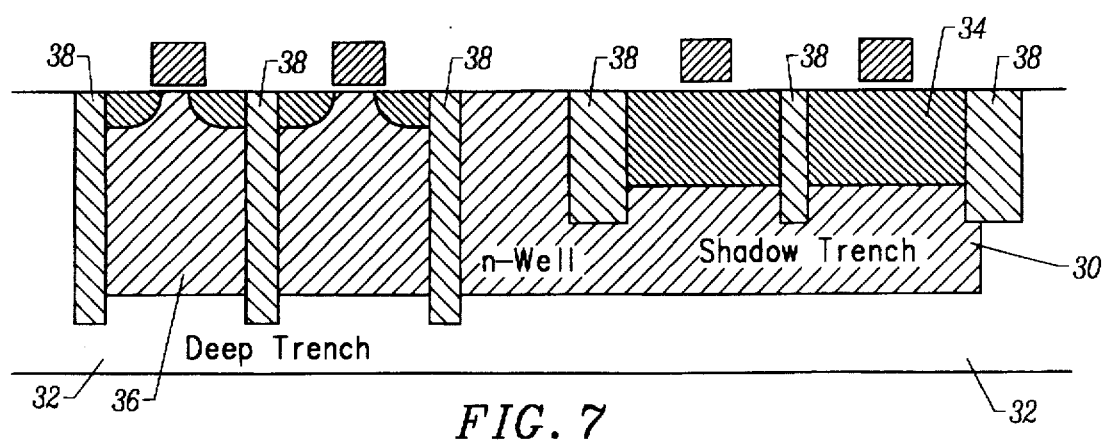

In a second embodiment of this invention, only deep n-wells (no shallow n-wells) are used as shown in FIG. 7 with trench isolation of two different depths. A p-well is formed inside the deep n-well. Within the p-well, n-channel transistors are formed, and within the deep n-well p-channel transistors are formed. Trench isolation with two different trench depths are used for device isolation: isolating trenches deeper than the deep n-wells are used to isolate the p-channel transistors; isolating trenches deeper than the shallow p-well but shallower than the deep n-wells are used to isolate the n-channel transistors. The technology of using and making trenches of different depths is well-known in the fabrication of BiCMOS circuits. The bias conditions are exactly the same as in the first embodiment.

Figure 8:
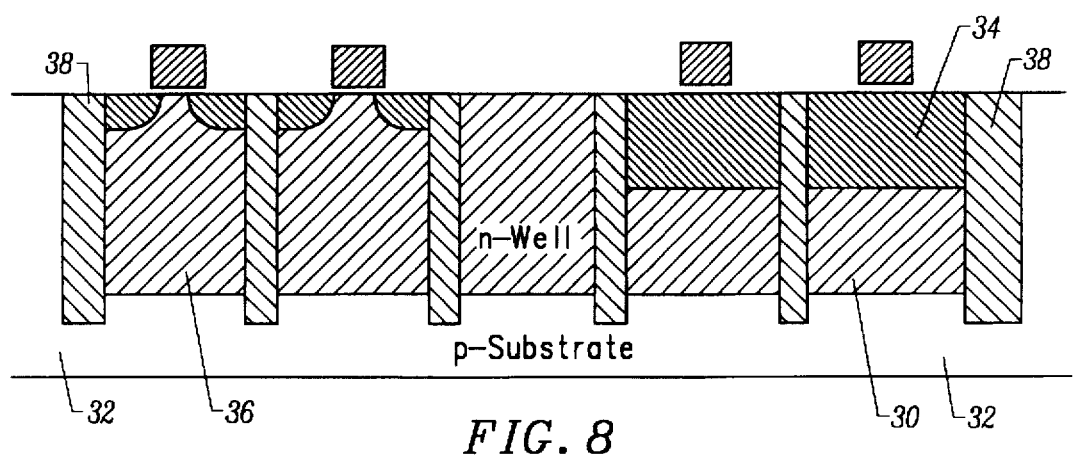

In a third embodiment of this invention, deep n-wells, shallow p-wells and deep trench are used as shown in FIG. 8. The p-channel transistors are the same as that in the second embodiment. The body of the n-channel transistors are now isolated by n-wells that are electrically floating. A floating well is sufficient to provide the isolation between the devices and to assure correct functionality and reliability when the operating voltage is low. At such low voltages there is no concern for CMOS latch-up, for example.

The DTMOS device in accordance with the invention can be used in combination with conventional CMOS devices in integrated circuits. DTMOS devices may be used when high performance, or low leakage is desired while the conventional CMOS devices may be used where performance or leakage may be traded off for better layout density. A device can be made a DTMOS or a CMOS by electrically connecting the body of the device to the gate, for DTMOS, and to $V_{DD}$ or $V_{SS}$, for CMOS.

There have been described DTMOS devices having delta-doped and counter-doped body regions which provide superior performance for high-end VLSI applications. While the invention has been described with reference to specific embodiments, the description is illustrative of the invention and not limiting the invention. Various modifications and applications may occur to those skilled in the art without departing from the true spirit and scope of the invention as defined by the appended claims.

What is claimed is:

1. For use in an integrated circuit operable at a power supply voltage of 0.6 volt or less, a dynamic threshold insulated gate field effect transistor comprising a semiconductor substrate having dopant of first conductivity type and first concentration and having a surface, a first doped well in said substrate and abutting said surface, said first doped well having dopant of second conductivity type and second concentration greater then said first concentration, a second doped well in said first doped well and abutting said surface, said second doped well having dopant of said first conductivity type and third concentration greater than said second concentration, a source region and a drain region of said second conductivity formed in said second doped well and abutting said surface, said source region and said drain region being spaced apart with a channel therebetween, an insulative layer on said surface over said channel region, a gate contact on said insulative layer and over said channel, a connector interconnecting said gate contact and said channel region, and a plurality of trenches etched from said surface through at least said second well to provide electrical isolation for said transistor.

2. The transistor as defined by claim 1 wherein said plurality of trenches extend through said first well and said second well into said substrate.

3. For use in an integrated circuit operable at a power supply voltage of 0.6 volt or less, a dynamic threshold insulated gate field effect transistor comprising a semiconductor substrate having dopant of first conductivity type and first concentration and having a surface, a first doped well in said substrate and abutting said surface, said first doped well having dopant of second conductivity type and second concentration greater then said first concentration, a second dopant well in said first doped well and abutting said surface, said second doped well having dopant of said first conductivity type and third concentration greater than said second concentration, a source region and a drain region of said first conductivity formed in said first doped well and abutting said surface, said source region and said drain region being spaced apart with a channel therebetween, an insulative layer on said surface over said channel region, a gate contact on said insulative layer and over said channel, a connector interconnecting said gate contact and said channel region, and a plurality of trenches etched from said surface through said first well to provide electrical isolation for said transistor.

4. For use in an integrated circuit operable at a power supply voltage of 0.6 volt or less, a dynamic threshold complementary field effect transistor pair comprising a semiconductor substrate having dopant of first conductivity type and first concentration and having a surface, a first doped well in said substrate and abutting said surface, said first doped well having a dopant of second conductivity type and second concentration greater than said first concentration, a second doped well in said first doped well and abutting said surface, said second doped well having a dopant of said first conductivity type and third concentration greater than said second concentration, a first source region and a first drain region of said second conductivity formed in said second doped well and abutting said surface, said source region and said drain region being spaced apart with a first channel region therebetween, an insulative layer on said surface over said channel region, a first gate contact on said insulative layer and over said channel, a connector interconnecting said gate contact and said channel region, a second source region and a second drain region of said first conductivity formed in said first doped well and abutting said surface, said second source region and said second drain region being spaced apart with a second channel therebetween, a second insulative layer over said surface of said second channel region, a second gate contact on said second insulative layer and over said second channel, and a second connector interconnecting said second gate contact and said second channel region.

* * * * *